United States Patent
Thei et al.

(10) Patent No.: US 6,350,662 B1
(45) Date of Patent: Feb. 26, 2002

(54) METHOD TO REDUCE DEFECTS IN SHALLOW TRENCH ISOLATIONS BY POST LINER ANNEAL

(75) Inventors: Kong-Beng Thei; Kuei-Ying Lee, both of Hsin-Chu; Dun-Nian Yaung, Taipei; Shou-Gwo Wuu, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/357,244

(22) Filed: Jul. 19, 1999

(51) Int. Cl.$^7$ .............................................. H01L 21/76
(52) U.S. Cl. ..................... 438/435; 438/424; 438/437
(58) Field of Search ............................... 438/427, 424, 438/435, 437

(56) References Cited

U.S. PATENT DOCUMENTS

| | | | |
|---|---|---|---|
| 4,472,873 A | 9/1984 | Ko | 29/576 B |
| 5,395,790 A | 3/1995 | Lur | 437/69 |
| 5,433,794 A | 7/1995 | Fazan et al. | 148/33.3 |
| 5,447,884 A | 9/1995 | Fahey et al. | 437/67 |
| 5,643,823 A | 7/1997 | Ho et al. | 437/67 |
| 5,858,858 A | 1/1999 | Park et al. | 438/424 |
| 5,981,355 A | * 11/1999 | Lee | 438/424 |
| 6,083,808 A | * 7/2000 | Shin et al. | 438/435 |

* cited by examiner

Primary Examiner—Trung Dang
(74) Attorney, Agent, or Firm—George O. Saile; Stephen B. Ackerman; Rosemary L. S. Pike

(57) ABSTRACT

A method to form shallow trench isolations with reduced substrate defects by using a nitrogen anneal is achieved. A silicon substrate is provided. The silicon substrate is etched where not protected by a photoresist mask to form shallow trenches where shallow trench isolations are planned. A liner oxide layer is grown on the interior surfaces of the shallow trenches. The silicon substrate and the liner oxide layer are annealed to reduce or eliminate defects, dislocations, interface traps, and stress in the silicon substrate. An isolation oxide layer is deposited overlying the liner oxide layer and completely filling the shallow trenches. The isolation oxide layer is etched down to the top surface of the silicon substrate and thereby forms the shallow trench isolations. The integrated circuit device is completed.

15 Claims, 4 Drawing Sheets

METHOD TO REDUCE DEFECTS IN SHALLOW TRENCH ISOLATIONS BY POST LINER ANNEAL

BACKGROUND OF THE INVENTION (1) Field of the Invention

The present invention relates to the fabrication of semiconductor structures, and more particularly, to a method to form shallow trench isolations in the manufacture of integrated circuits.

(2) Description of the Prior Art

As integrated circuit feature sizes continue to shrink, one of the limiting factors in this size reduction is the technique for active area isolation. Traditionally in the art, active areas have been isolated from each other through the formation of local oxidation of silicon, or LOCOS, structures. LOCOS structures provide good electrical isolation of active areas such as transistor source and drain regions. However, LOCOS structures consume substantial amounts of silicon surface area. This means that the available area for active devices such as transistors is reduced. Further, the LOCOS structure is three-dimensional and creates a non-planar surface topology that adversely affects the process yield and complexity of the processing steps that come after the LOCOS formation.

To reduce the silicon area used for isolation regions and to improve the planarity of these regions, a new technique, called shallow trench isolation, or STI, has been developed. In STI, trenches or grooves are etched into the top surface of the silicon wafer. These grooves are then filled with an isolating dielectric such as silicon oxide. This isolating dielectric is then made planar to the surface of the substrate by etching or chemical mechanical polishing (CMP). STI structures made in this way can be made substantially smaller than comparable LOCOS structures. Therefore less of the silicon surface is used for isolation and more is available for active devices. Since the STI structures are made planar, the processing problems presented by the LOCOS surface topology are solved.

Referring now to FIG. 1, a prior art shallow trench isolation is shown in cross-section. A semiconductor substrate 10 is shown. A shallow trench is etched into the semiconductor substrate 10 and lined with a thermally grown oxide 14. An isolation oxide 18 is shown deposited to complete the shallow trench isolation. Overlying the semiconductor substrate 10 and the shallow trench isolation is a gate oxide 22. A polysilicon structure 26, such as a transistor gate, overlies the gate oxide 22. Finally, a passivation layer 30 overlies the polysilicon structure 26.

Two locations in the prior art structure should be especially noted. The top corners 34 of the shallow trench isolation, where the trench meets the top surface of the semiconductor substrate, and the bottom corners 38 of the trench are areas where a variety of problems can occur. The reactive ion etch (RIE) process used to etch the trench causes the formation of substrate defects, dislocations, and interface traps. The thermally grown oxide liner 14 also induces stresses into the semiconductor substrate 10. All of these defects and conditions are especially pronounced at the corner regions 34, 38 of the trench.

The presence of substrate defects, dislocation, and interface traps, as well as substrate stress, causes several problems. First, where these conditions occur at the top corners 34, it is detrimental to the integrity of the gate oxide layer 22 formed overlying the trench. The voltage required to breakdown the gate oxide layer 22 is a measurement of the integrity of the gate oxide layer 22. The presence of substrate defects near the gate oxide layer 22 reduces the measured breakdown voltage.

Second, junction breakdown voltages are also adversely effected by the shallow trench isolation defects, both at the top corners 34 and at the bottom corners 38. As the breakdown voltage decreases, the integrated circuit device becomes unreliable or the operating voltage range must be limited.

Finally, in the manufacture of dynamic random access memory (DRAM) and static random access memory (SRAM) devices, shallow trench isolation defects, such as described above, cause reduced data retention times and increased power dissipation. Yield is reduced as integrated circuit devices cannot meet product specifications.

Several prior art approaches attempt to improve shallow trench isolation technology. U.S. Pat. No. 5,433,794 to Fazan et al teaches a process to create a shallow trench isolation with a dome-shaped oxide plug to reduce leakage current. U.S. Pat. No. 4,472,873 to Ko discloses a process where a nitrogen anneal is performed to reduce stacking faults in a silicon substrate due to ion implantation. U.S. Pat. No. 5,447,884 to Fahey et al discloses the use of a nitride liner layer for a shallow trench isolation and a pyrogenic oxide anneal at 800 degrees C. to drive out impurities and to reduce structural stress. U.S. Pat. No. 5,395,790 to Lur teaches a process to form a stress-free isolation layer. Stress-relief trenches are etched through the isolation oxide plug. An anneal is performed and the stress reduction trenches are refilled. U.S. Pat. No. 5,643,823 to Ho et al discloses a process to form a crystalline silicon nitride liner layer for a shallow trench isolation. A pure nitrogen or ammonia anneal of the silicon nitride layer is performed to crystallize the silicon nitride. U.S. Pat. No. 5,858,858 to Park et al teaches a process to form shallow trench isolations where a nitrogen anneal is performed after the trench oxide is deposited to fill the trench.

SUMMARY OF THE INVENTION

A principal object of the present invention is to provide an effective and very manufacturable method of fabricating integrated circuits with shallow trench isolations.

A further object of the present invention is to provide a method of fabricating shallow trench isolations using a nitrogen anneal after oxide liner growth to reduce or eliminate substrate defects, dislocations, interface traps, and structural stress.

Another further object of the present invention is to provide a method of fabricating shallow trench isolations using a nitrogen anneal after oxide liner growth to reduce the likelihood of shallow trench isolation induced low gate oxide breakdown voltages and high junction leakage currents.

In accordance with the objects of this invention, a new method of fabricating an integrated circuit with shallow trench isolations using a nitrogen anneal after liner oxide growth is achieved. A semiconductor substrate layer is provided. A pad oxide layer is grown overlying the semiconductor substrate. A silicon nitride layer is deposited overlying the pad oxide layer. A photoresist layer is deposited overlying the silicon nitride layer and is developed to expose the silicon nitride layer in areas where shallow trench isolations are planned. The silicon nitride layer, the pad oxide layer, and the semiconductor substrate are etched where the silicon nitride layer is not protected by a photoresist mask and where the etching forms shallow trenches. The photoresist layer is stripped away. A liner oxide layer is grown overlying the semiconductor substrate on the interior surfaces of the shallow trenches. An anneal is performed on the semiconductor substrate and the liner oxide layer to reduce semiconductor substrate defects, dislocations, interface traps, and stress. An isolation oxide layer is deposited overlying the silicon nitride layer and the liner oxide layer to completely fill the shallow trenches. The isolation oxide layer is etched down to the top surface of the silicon nitride layer. The silicon nitride layer is etched away. The isolation oxide layer and the pad oxide layer are etched down to the top surface of the semiconductor substrate to thereby form the shallow trench isolations, and the fabrication of the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
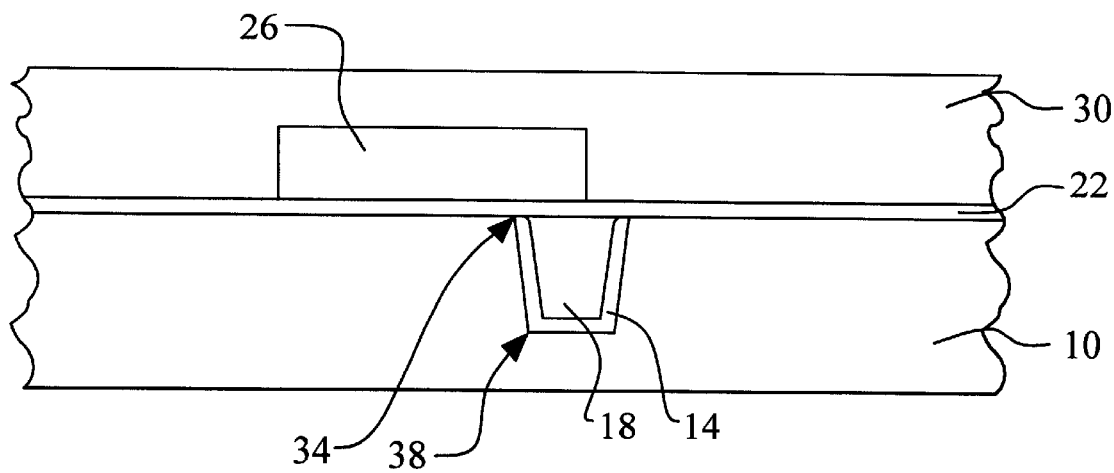
FIG. 1 schematically illustrates in cross-section a shallow trench isolation in a prior art integrated circuit.
Figure 2:
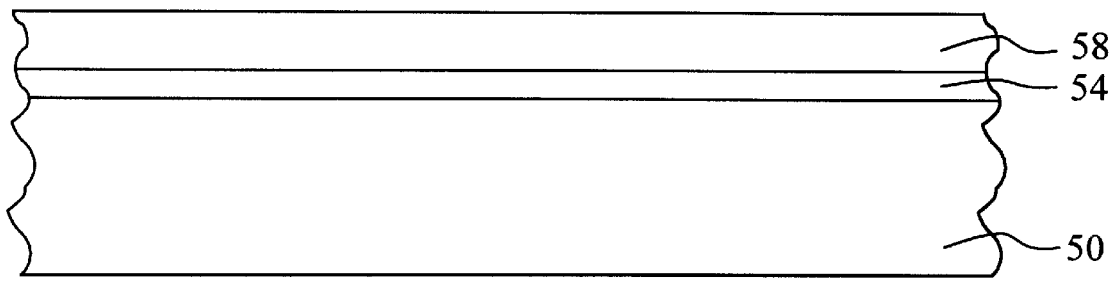
FIGS. 2 through 11 schematically illustrate in cross-sectional representation the present invention used to form shallow trench isolations in an integrated circuit device.

Referring now more particularly to FIG. 2, there is illustrated a portion of a partially completed integrated circuit. A semiconductor substrate 50 is provided. The semiconductor substrate 50 is preferably composed of monocrystalline silicon that may be doped with impurity ions to achieve an n-type or p-type carrier concentration. A pad oxide layer 54 is grown overlying the semiconductor substrate 50. The pad oxide layer 54 improves the adhesion of the subsequently deposited silicon nitride layer 58. The pad oxide layer 54 is preferably grown using a conventional thermal oxidation process. The silicon nitride layer 58 is deposited overlying the pad oxide layer 54 by a conventional low pressure chemical vapor deposition process (LPCVD).

Figure 3:
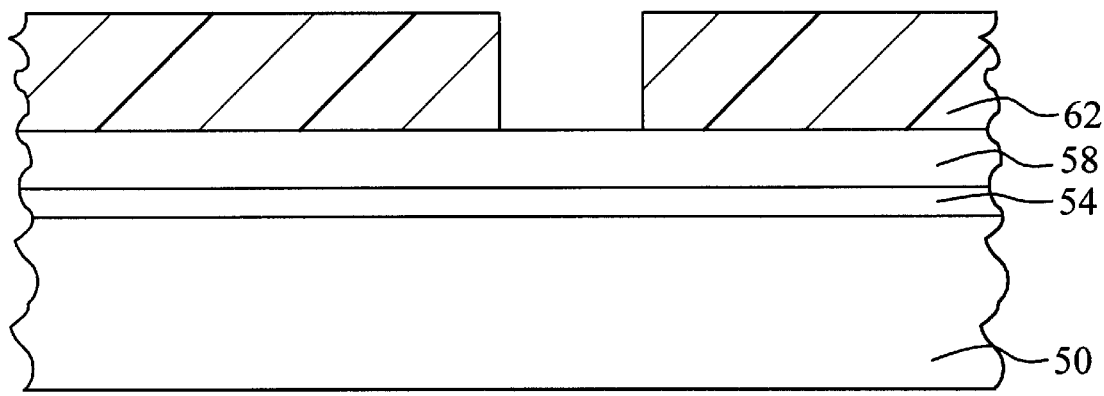

Referring now to FIG. 3, a photoresist layer 62 is deposited overlying the silicon nitride layer 58. The photoresist layer 62 is developed to expose the silicon nitride layer 58 in areas where the shallow trench isolations are planned.

Figure 4:
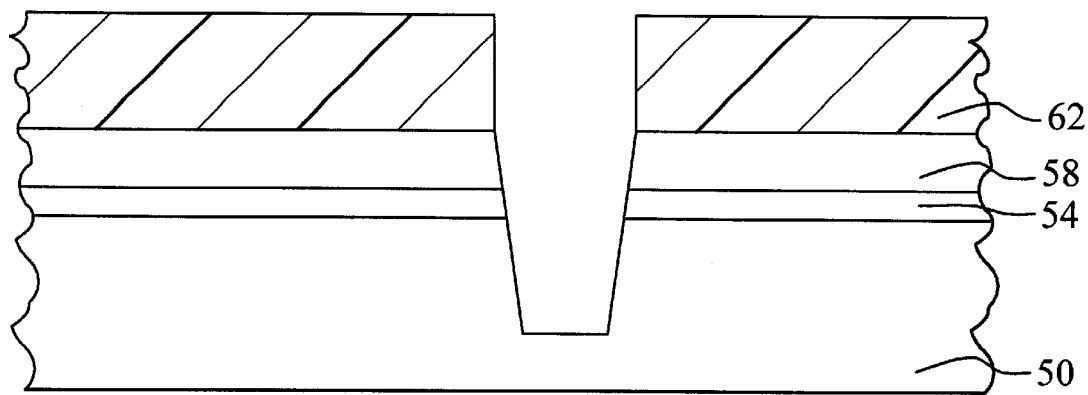

Referring to FIG. 4, the silicon nitride layer 58, the pad oxide layer 54, and the semiconductor substrate 50 are etched where the silicon nitride layer is not protected by the photoresist mask. The etching step forms shallow trenches. This etching step is performed using a reactive ion etching (RIE) sequence. The silicon nitride layer 58 is etched using $CF_4$ and $CHF_3$ gases. The pad oxide layer 54 and the semiconductor substrate are etching using HBr, $Cl_2$, and $O_2$ gases.

Figure 5:
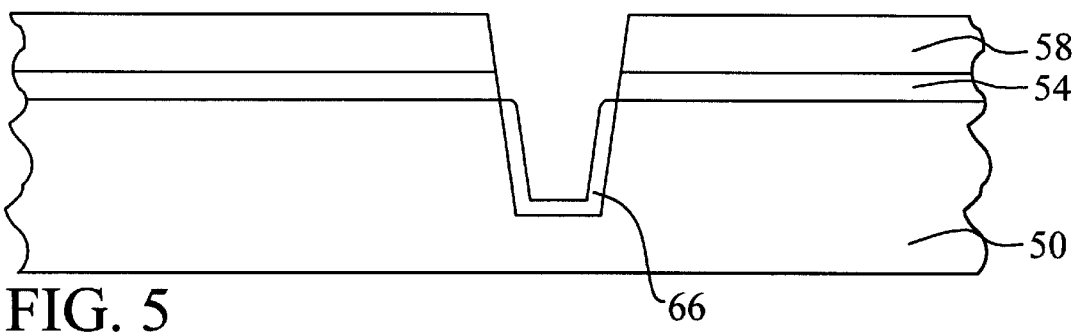

Referring now to FIG. 5, the photoresist layer 62 is stripped away. A liner oxide layer 66 is grown overlying the semiconductor substrate 50 on the interior surfaces of the shallow trenches. The purpose of the liner oxide layer 66 is to form a high quality oxide to serve as a surface interface between the semiconductor substrate 66 and the subsequently deposited isolation oxide. In the preferred embodiment, the liner oxide layer 66 is thermally grown in one of two ways. First, it may be grown by a process using dry oxygen ($O_2$) at a temperature of between about 900 degrees C. and 950 degrees C. The liner oxide layer 66 so grown has a thickness of between about 200 Angstroms and 400 Angstroms. Second, the liner oxide layer 66 may be grown using a wet process using $H_2$ and $O_2$ at a temperature of between about 800 degrees C. and 900 degrees C. The oxide liner layer 66 formed by the wet process will have a thickness of between about 200 Angstroms and 400 Angstroms.

Figure 6:
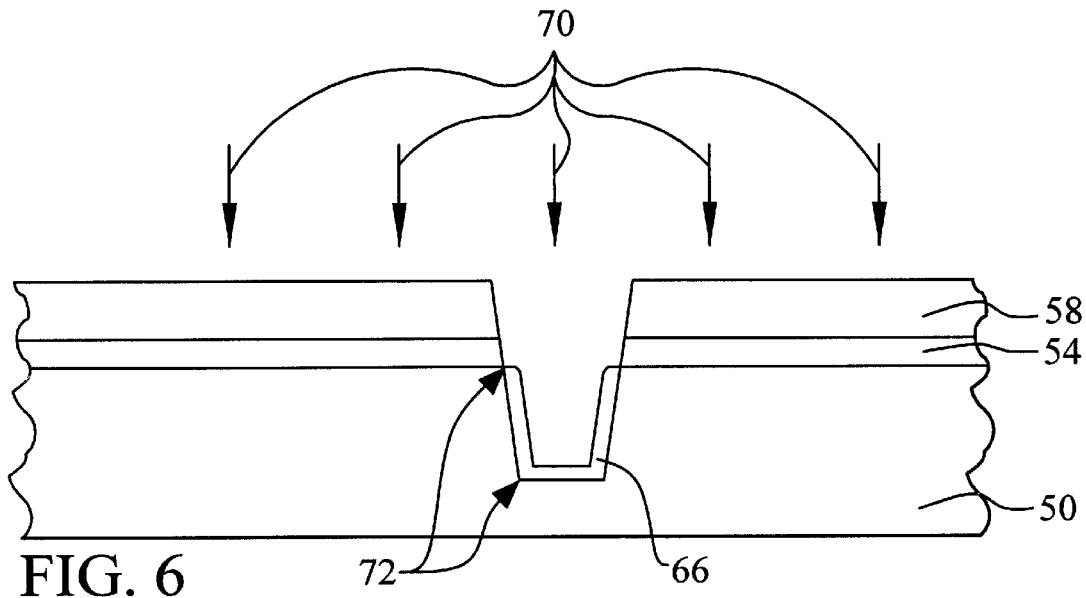

Referring now to FIG. 6, an important feature of the present invention is described. A nitrogen anneal 70 is performed on the semiconductor substrate 50 and the liner oxide layer 66 to reduce semiconductor substrate 50 defects, dislocations, interface traps, and stress. The anneal is performed following the growth of the liner oxide layer 66 so that it will effectively repair all of the damage done to the semiconductor substrate 50 during the reactive ion etching step and the liner oxide layer 66 growth step. The anneal 70 is performed in an atmosphere of nitrogen ($N_2$) at a temperature of between about 1000 degrees C. and 1150 degrees C. for between about 30 minutes and 150 minutes.

Figure 7:
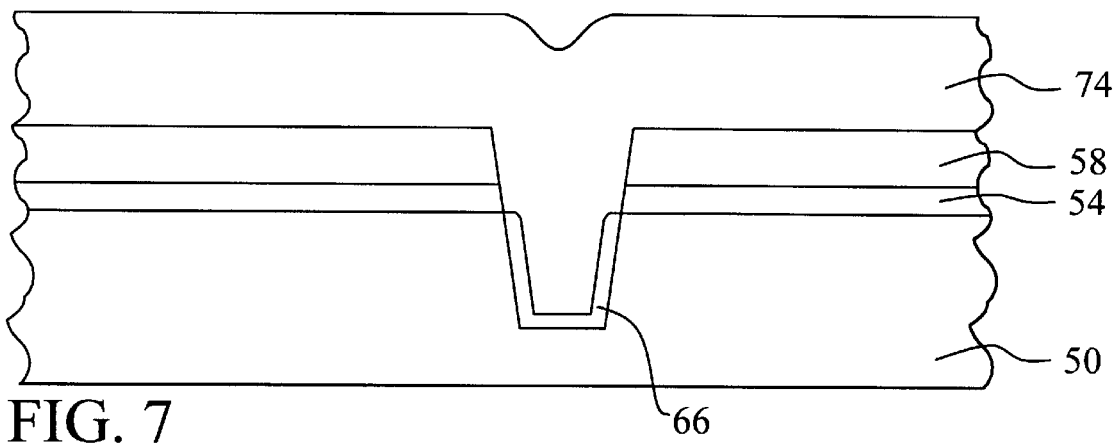

Referring now to FIG. 7, an isolation oxide layer 74 is deposited overlying the silicon nitride layer 58 and the liner oxide layer 66 to completely fill the shallow trenches. The isolation oxide layer 74 is preferably composed of a silicon oxide material deposited by high density plasma deposition (HDP) in a low pressure chemical vapor deposition (LPCVD) process. The isolation oxide layer 74 so deposited has a thickness of between about 5,500 Angstroms and 6,500 Angstroms.

Figure 8:
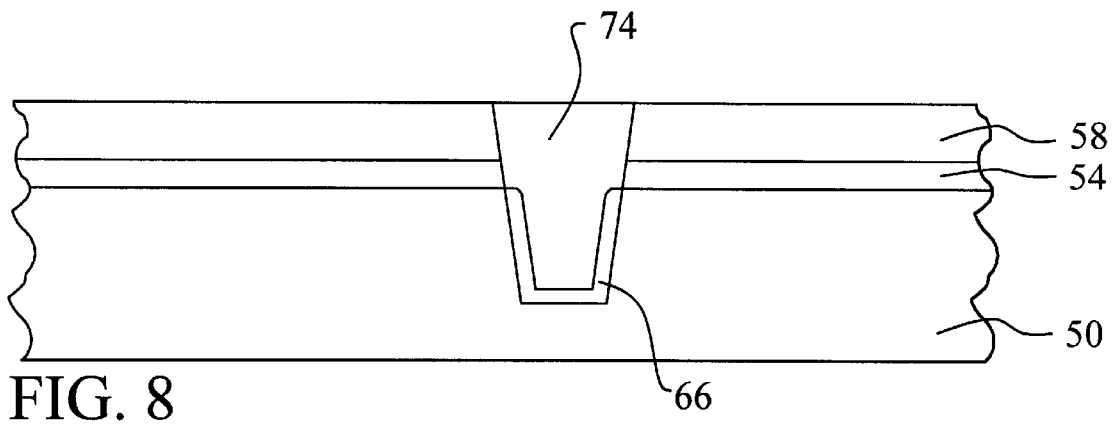

Referring now to FIG. 8, the isolation oxide layer 74 is etched down to the top surface of the silicon nitride layer 58. The etching down process may be by dry etching or by chemical mechanical polishing. In the preferred embodiment, a chemical mechanical polish step is used to etch down the isolation oxide layer 74 with the silicon nitride layer 58 serving as a polishing stop.

Figure 9:
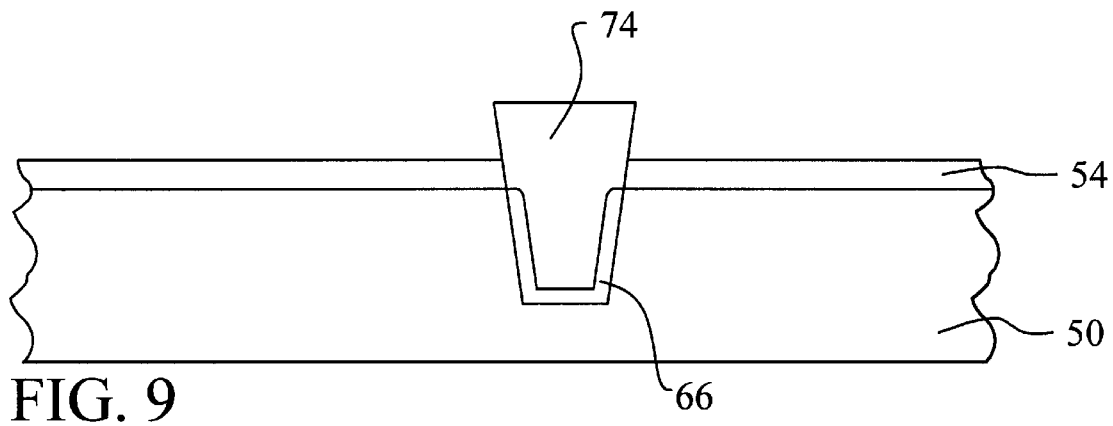

Referring to FIG. 9, the silicon nitride layer 58 is etched away using a conventional reactive ion etching process.

Figure 10:
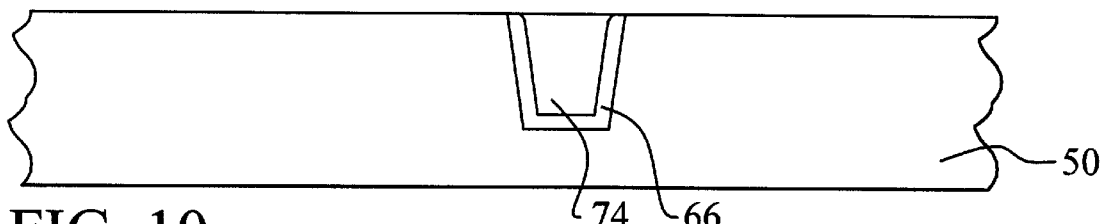
Figure 11:
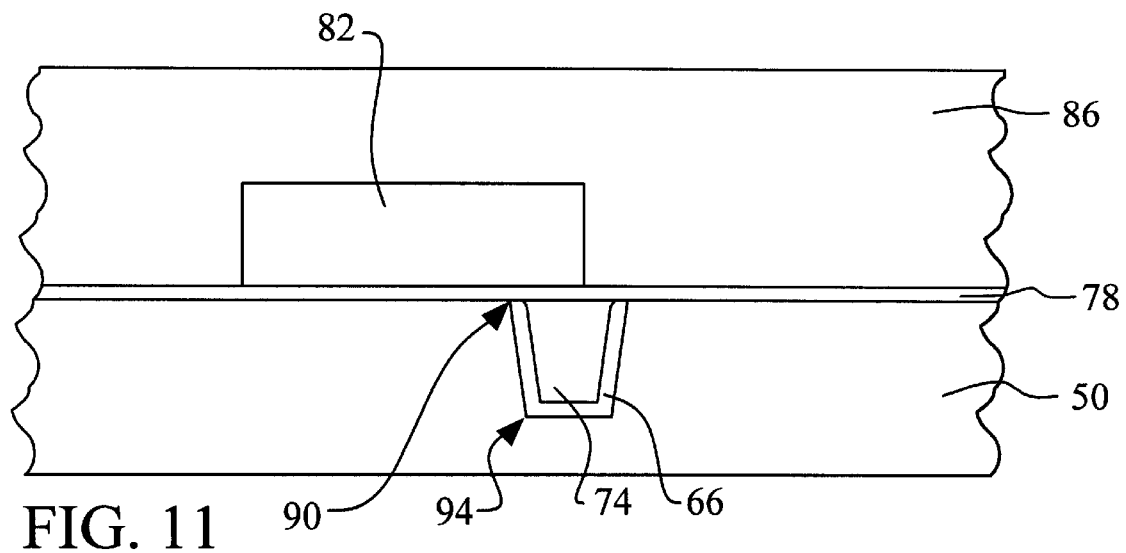

Referring to FIG. 10, the isolation oxide layer 74 and the pad oxide layer 54 are etched down to the top surface of the semiconductor substrate 50 to thereby form the shallow trench isolations. In the preferred embodiment, this etch down step is accomplished by a chemical mechanical polish operation (CMP).

Following the formation of the shallow trench isolations, subsequent processing steps are used, as typical in the art, to fabricate active and passive components, connective traces and isolations to form the useful circuits of the integrated circuit device. As shown in the schematic, a gate oxide layer 78 is thermally grown overlying the semiconductor substrate 50 and the shallow trench isolation. A polysilicon feature 82, such as the gate electrode of a MOSFET device, is deposited and defined overlying the gate oxide layer 78. Finally, a passivation layer 86 is deposited overlying the entire circuit to provide a conformal protective barrier for the now completed integrated circuit device.

It can now be seen how the novel process of the present invention is an improvement over the prior art. The critical locations of the shallow trench isolation top corners 90 and bottom corners 94 are noted. Because of the inclusion of an anneal process after the reactive ion etch and the liner oxide layer 66 thermal growth, the detrimental semiconductor substrate 50 conditions of the prior art process are eliminated. The anneal step reduces the population of defects, dislocations, and interface traps caused by the etch and relieves structural stress induced by the thermal oxidation process. Because these conditions are reduced at the critical locations 90 and 94, the problems of low gate oxide breakdown voltages and high junction reverse bias leakage currents caused by shallow trench isolation defects are eliminated.

Experimental data confirm that the novel process of the present invention reduces the occurrence of junction leakage defects and low gate oxide breakdown voltage defects. For memory products, such as DRAM and SRAM, this is a very important breakthrough. Yield improvements of 25% and greater have been confirmed by experimental lots. Yield improvements have been especially significant for shallow trenches of about 3500 Angstroms where the RIE etch process appears to do greater substrate damage than it does to trenches of, for example, about 2500 Angstroms to about 3000 Angstroms.

The process of the present invention provides a very manufacturable method for fabricating improved shallow trench isolations in the fabrication of an integrated circuit device.

While the invention has been particularly shown and described with reference to the preferred embodiments thereof, it will be understood by those skilled in the art that various changes in form and details may be made without departing from the spirit and scope of the invention.

What is claimed:

1. A method to form shallow trench isolations in the fabrication of an integrated circuit device comprising:

providing a semiconductor substrate;

etching said semiconductor substrate to form shallow trenches where shallow trench isolations are planned;

growing a liner oxide layer on the interior surfaces of said shallow trenches;

thereafter annealing said semiconductor substrate and said liner oxide layer to reduce or eliminate defects, dislocations, interface traps, and stress in said semiconductor substrate;

depositing a high density plasma oxide isolation layer by low pressure chemical vapor deposition overlying said liner oxide layer and completely filling said shallow trenches;

etching down said high density plasma oxide isolation layer to the top surface of said semiconductor substrate and thereby forming said shallow trench isolations; and completing said integrated circuit device.

2. The method according to claim 1 wherein said step of etching said semiconductor substrate to form shallow trenches is by reactive ion etching.

3. The method according to claim 1 wherein said step of growing said liner oxide layer is by a dry $O_2$ process at a temperature of between about 900 degrees C. and 950 degrees C. and wherein said liner oxide layer is grown having a thickness of between about 200 Angstroms and 400 Angstroms.

4. The method according to claim 1 wherein said step of growing said liner oxide layer is by a wet process using $O_2$ and $H_2$ at a temperature of between about 800 degrees C. and 900 degrees C. and wherein said liner oxide layer is grown having a thickness of between about 200 Angstroms and 400 Angstroms.

5. The method according to claim 2 wherein said step of annealing is performed in an atmosphere of nitrogen ($N_2$) at a temperature of between about 1000 degrees C. and 1150 degrees C. for between about 30 minutes and 150 minutes.

6. The method according to claim 1 wherein said high density plasma oxide isolation layer is deposited having a thickness of between about 5,500 Angstroms and 6,500 Angstroms.

7. The method according to claim 1 wherein said step of etching down said isolation oxide layer is by chemical mechanical polishing.

8. A method to form shallow trench isolations in the fabrication of an integrated circuit device comprising:

providing a semiconductor substrate;

growing a pad oxide layer overlying said semiconductor substrate;

depositing a silicon nitride layer overlying said pad oxide layer;

etching said silicon nitride layer, said pad oxide layer, and said semiconductor substrate to form shallow trenches where shallow trench isolations are planned;

growing a liner oxide layer on the interior surfaces of said shallow trenches by a dry $O_2$ process at a temperature of between about 900 degrees C. and 950 degrees C.;

thereafter annealing said semiconductor substrate and said liner oxide layer to reduce or eliminate defects, dislocations, interface traps, and stress in said semiconductor substrate;

depositing a high density plasma oxide isolation layer by low pressure chemical vapor deposition overlying said liner oxide layer and completely filling said shallow trenches;

etching down said high density plasma oxide isolation layer to the top surface of said silicon nitride layer by chemical mechanical polishing;

etching away said silicon nitride layer;

etching down said high density plasma oxide isolation layer and said pad oxide layer to the top surface of said semiconductor substrate by chemical mechanical polishing and thereby forming said shallow trench isolations; and completing said integrated circuit device.

9. The method according to claim 8 wherein said step of etching said silicon nitride layer, said pad oxide layer, and said semiconductor substrate to form shallow trenches is by reactive ion etching.

10. The method according to claim 8 wherein said liner oxide layer is grown having a thickness of between about 200 Angstroms and 400 Angstroms.

11. The method according to claim 8 wherein said step of annealing is performed in an atmosphere of nitrogen ($N_2$) at a temperature of between about 1000 degrees C. and 1150 degrees C. for between about 30 minutes and 150 minutes.

12. The method according to claim 8 wherein said high density plasma oxide isolation layer is deposited having a thickness of between about 5,500 Angstroms and 6,500 Angstroms.

13. A method to form shallow trench isolations in the fabrication of an integrated circuit device comprising:

providing a semiconductor substrate;

growing a pad oxide layer overlying said semiconductor substrate;

depositing a silicon nitride layer overlying said pad oxide layer;

etching said silicon nitride layer, said pad oxide layer, and said semiconductor substrate by reactive ion etching to form shallow trenches where shallow trench isolations are planned;

growing a liner oxide layer on the interior surfaces of said shallow trenches by a wet process using $O_2$ and $H_2$ at a temperature of between about 800 degrees C. and 900 degrees C.;

thereafter annealing said semiconductor substrate and said liner oxide layer in an atmosphere of nitrogen (N$_2$) at a temperature of between about 1000 degrees C. and 1150 degrees C. for between about 30 minutes and 150 minutes to reduce or eliminate defects, dislocations, interface traps, and stress in said semiconductor substrate;

depositing a high density plasma oxide isolation layer by low pressure chemical vapor deposition overlying said liner oxide layer and completely filling said shallow trenches;

etching down said high density plasma oxide isolation layer to the top surface of said silicon nitride layer by chemical mechanical polishing;

etching away said silicon nitride layer;

etching down said high density plasma oxide isolation layer and said pad oxide layer to the top surface of said semiconductor substrate by chemical mechanical polishing and thereby forming said shallow trench isolations; and completing said integrated circuit device.

14. The method according to claim 13 wherein said liner oxide layer is grown having a thickness of between about 200 Angstroms and 400 Angstroms.

15. The method according to claim 13 wherein said high density plasma oxide isolation layer is deposited having a thickness of between about 5,500 Angstroms and 6,500 Angstroms.

* * * * *